US 9,758,864 B2

(12) United States Patent
Matos et al.

(10) Patent No.: US 9,758,864 B2
(45) Date of Patent: Sep. 12, 2017

(54) OPEN AIR PLASMA DEPOSITION METHOD

(71) Applicant: The Boeing Company, Chicago, IL (US)

(72) Inventors: Marvi A. Matos, Seattle, WA (US); Liam S. Pingree, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/867,196

(22) Filed: Sep. 28, 2015

(65) Prior Publication Data

US 2016/0053369 A1    Feb. 25, 2016

Related U.S. Application Data

(62) Division of application No. 13/286,957, filed on Nov. 1, 2011, now Pat. No. 9,145,602.

(51) Int. Cl.
| | | |
|---|---|---|
| *C23C 14/56* | (2006.01) | |
| *C23C 14/22* | (2006.01) | |
| *C23C 14/46* | (2006.01) | |
| *H01J 37/32* | (2006.01) | |

(52) U.S. Cl.
CPC .......... *C23C 14/56* (2013.01); *C23C 14/228* (2013.01); *C23C 14/46* (2013.01); *H01J 37/32357* (2013.01); *H01J 37/32752* (2013.01); *H01J 37/32761* (2013.01); *H01J 37/32825* (2013.01); *H01J 37/32889* (2013.01)

(58) Field of Classification Search
None
See application file for complete search history.

(56) References Cited

U.S. PATENT DOCUMENTS

| | | |
|---|---|---|
| 3,600,292 A | 8/1971 | Nathanson et al. |
| 3,654,110 A * | 4/1972 | Kraus ................ C23C 14/3407 204/192.12 |
| 4,426,275 A | 1/1984 | Meckel et al. |
| 4,471,224 A | 9/1984 | Cuomo et al. |

(Continued)

FOREIGN PATENT DOCUMENTS

| | | |
|---|---|---|
| CN | 101681781 A | 3/2010 |
| GB | 1224284 A | 3/1971 |

(Continued)

OTHER PUBLICATIONS

English Translation of Notices of Reasons for Rejection issued Jul. 4, 2016, regarding Japanese Patent Application No. 2014-538808, 7 pages.

(Continued)

*Primary Examiner* — Joseph Miller, Jr.
(74) *Attorney, Agent, or Firm* — Yee & Associates, P.C.

(57) ABSTRACT

An apparatus may comprise a plasma deposition unit, a movement system, and a mesh system. The plasma deposition unit may be configured to generate a plasma. The movement system may be configured to move a substrate under the plasma deposition unit. The mesh system may be located between the plasma deposition unit and the substrate in which a mesh may comprise a number of materials for deposition onto the substrate and in which the plasma passing through the mesh may cause a portion of the number of materials from the mesh to be deposited onto the substrate.

12 Claims, 9 Drawing Sheets

(56) References Cited

U.S. PATENT DOCUMENTS

| | | | |
|---|---|---|---|
| 4,591,417 A | | 5/1986 | Kaiser et al. |
| 5,069,770 A | * | 12/1991 | Glocker .............. C23C 14/3407 204/192.12 |
| 5,133,849 A | | 7/1992 | Kinoshita et al. |
| 9,145,602 B2 | | 9/2015 | Matos et al. |
| 2003/0159644 A1 | * | 8/2003 | Yonehara .......... H01L 21/76251 117/8 |
| 2005/0205415 A1 | | 9/2005 | Belousov et al. |
| 2009/0065349 A1 | | 3/2009 | Kim et al. |
| 2011/0104382 A1 | | 5/2011 | Morimoto et al. |
| 2011/0266139 A1 | * | 11/2011 | Matsumura ............ C23C 14/228 204/192.12 |
| 2012/0024695 A1 | * | 2/2012 | Black ...................... C23C 14/50 204/192.29 |
| 2013/0108803 A1 | | 5/2013 | Matos et al. |

FOREIGN PATENT DOCUMENTS

| | | |
|---|---|---|
| JP | S55141721 A | 11/1980 |
| JP | 2005273016 A | 10/2005 |
| JP | 200141825 A | 6/2009 |
| TW | I293338 B | 2/2008 |
| WO | WO2005083149 A1 | 9/2005 |
| WO | WO2008106448 A2 | 9/2008 |

OTHER PUBLICATIONS

International Search Report and Written Opinion, dated Jan. 16, 2013, regarding Application No. PCT/US2012/058363, 8 pages.
International Preliminary Report on Patentability dated May 6, 2014, regarding Application No. PCT/US2012/058363, 5 pages.
"Cold Plasma Surface Treatments," Coating Plasma Industrie, 4 pages. Accessed Oct. 7, 2011, http://www.cpi-plasma.com/index_uk.php?page=accue_uk.
Bardos et al., "Cold atmospheric plasma: Sources, processes, and application," Thin Solid Films, vol. 518, Iss. 23, Sep. 2010, pp. 6705-6713.
Bhosle et al., "Electrical properties of transparent and conducting Ga doped ZnO," J. Appl. Phys. vol. 100, Aug. 2006, 6 pages.
Gulino et al., "Synthesis and Characterization of Liquid MOCVD Precursors for Thin Films of Cadmium Oxide," Chem. Mater., Nov. 2002, vol. 14, No. 12, pp. 4955-4962.
Izu et al., "Continuous Roll-to-Roll Serpentine Deposition for High Throughput a-Si PV Manufacturing," First World Conference on Photovoltaic Energy Conversion, Dec. 1994, pp. 810-823.
Metz et al., "Transparent Conducting Oxides: Texture and Microstructure Effects on Charge Carrier Mobility in MOCVD-Derived CdO Thin Films Grown with a Thermally Stable, Low-Melting Precursor," J. Am. Chem. Soc., vol. 126, No. 27, Jun. 2004, pp. 8477-8492.
Stauss et al., "High rate deposition of Zn0 thin films by a small-scale inductively coupled argon plasma generated in open air," Journal of Physics D: Applied Physics, vol. 43, Num. 15, Mar. 2010, 10 pages.
Suzaki et al., "Deposition of Zn0 film using an open-air cold plasma generator," Thin Solid Films, vols. 506-507, May 2006, pp. 155-158.
Wolf, "New Plasma Technology for Continuous Solar Manufacturing Processes," Webinar presentation, Enercon Industries Corporation, accessed Oct. 7, 2011, 35 pages.
Office Action, dated Dec. 9, 2014, regarding U.S. Appl. No. 13/286,957, 32 pages.
Final Office Action, dated Feb. 2, 2015, regarding U.S. Appl. No. 13/286,957, 21 pages.
Notice of Allowance, dated May 21, 2015, regarding U.S. Appl. No. 13/286,957, 9 pages.
State Intellectual Property Office of the People's Republic of China Office Action and English Translation, dated Sep. 14, 2016, regarding Application No. 2012800541459, 21 pages.

* cited by examiner

OPEN AIR PLASMA DEPOSITION METHOD

CROSS-REFERENCE TO RELATED APPLICATION

This application is a division of and claims the benefit of priority to U.S. patent application Ser. No. 13/286,957, filed on Nov. 1, 2011 and entitled "Open Air Plasma Deposition System", the contents of which are incorporated herein by reference.

BACKGROUND INFORMATION

1. Field

The present disclosure relates generally to fabricating devices and, in particular, to depositing materials onto substrates.

2. Background

In the deposition of layers of material to form thin films and/or coatings for the manufacturing of durable and multifunctional layers, a layer of material may be deposited on a substrate as part of the process. Thin film deposition may be relevant to the manufacturing of devices. These devices may include, for example, without limitation, semiconductor circuits and computer displays. These thin films may be a part of the electronic operational functions of the device or may be used as protection layers for erosion and/or abrasion.

A layer of material also may be deposited in forming optical coatings on optics. These optical coatings may offer, for example, without limitation, anti-reflective and/or anti-icing properties.

The deposition of materials onto substrates may be performed in a number of different ways. For example, the materials may be deposited using physical vapor deposition, chemical vapor deposition, electrochemical deposition, molecular beam epitaxy, and other types of deposition.

Some forms of deposition may use plasma. For example, chemical vapor deposition may be implemented using plasma. This type of deposition may be referred to as plasma-enhanced chemical vapor deposition, plasma vapor deposition, atmospheric plasma deposition, and/or open air plasma deposition.

When using plasma to deposit a layer of material, the deposition of material onto the substrate may occur in vacuum and/or atmospheric conditions. Substrates may be coated with various materials, such as, for example, without limitation, oxides, metals, polymers, and other suitable types of materials.

Typically, plasma deposition systems have been developed using vacuum conditions. However, using plasma deposition under vacuum conditions may require additional bulky, expensive equipment and complexity to obtain the appropriate vacuum conditions for depositing materials onto the substrate.

Interest in atmospheric deposition systems may rely on cost effectiveness and the versatility of this type of deposition technique. These systems may be designed in mobile modular structures for use in field-related applications outside of a laboratory or plant.

Atmospheric deposition systems may also be referred to as open-air deposition systems. With atmospheric conditions, bulky and costly vacuum pumps and other equipment for providing vacuum environments may be avoided.

These types of deposition systems, however, still may not provide as much throughput as desired for processing substrates. Also, these systems may not provide as much control as desired in depositing material onto a substrate.

Therefore, it would be advantageous to have a method and apparatus that takes into account at least some of the issues discussed above, as well as possibly other issues.

SUMMARY

In one advantageous embodiment, an apparatus may comprise a plasma deposition unit, a movement system, and a mesh system. The plasma deposition unit may be configured to generate a plasma. The movement system may be configured to move a substrate under the plasma deposition unit. The mesh system may be located between the plasma deposition unit and the substrate in which a mesh may comprise a number of materials for deposition onto the substrate and in which the plasma passing through the mesh may cause a portion of the number of materials from the mesh to be deposited onto the substrate.

In another advantageous embodiment, a method for depositing materials may be present. A plasma may be directed from a plasma deposition unit through a mesh system located between the plasma deposition unit and a substrate in which a mesh may be comprised of a number of materials. The plasma may cause a portion of the number of materials from the mesh to be deposited onto the substrate. The substrate may be moved relative to the plasma. The number of materials may be deposited onto the substrate.

In still another advantageous embodiment, an atmospheric plasma deposition system may comprise a plasma deposition unit, a movement system, a mesh system, and a controller. The plasma deposition unit may have a number of nozzles configured to generate a plasma. The movement system may be configured to move a substrate under the plasma deposition unit in which the substrate may be selected from one of a flexible material and a semiconductor substrate. The mesh system may have a number of meshes located between the plasma deposition unit and the substrate in which a mesh in the number of meshes may be associated with the number of nozzles. The number of meshes may comprise a number of materials for deposition onto the substrate. The plasma passing through the mesh may cause a portion of the number of materials from the mesh to be deposited onto the substrate. The number of materials may be deposited in a configuration selected from sections and a gradient in which an amount of a material in the number of materials deposited varies. The number of materials may be selected from at least one of conductive polymers, non-conductive polymers, semi-conductive polymers, metals, metal alloys, dielectrics, carbon, graphites, oxides, aluminum, aluminum oxide, zinc oxide, aluminum copper, aluminum doped zinc oxide, gallium doped zinc oxide, paint, and highly-oriented pyrolytic graphite. The controller may be configured to control operation of the plasma deposition unit, the movement system, and a number of parameters for depositing the number of materials onto the substrate. The number of parameters may comprise at least one of an amount of the number of materials, a type of material for the number of materials, a pattern of the number of materials, and an area in which the number of materials may be deposited onto a surface of the substrate.

In yet another advantageous embodiment, a method for plasma deposition of materials on a substrate may be present. A number of meshes for a mesh system may be selected for a number of nozzles in a plasma deposition unit based on a desired configuration for a number of materials to be deposited onto the substrate in which the number of materials may be selected from at least one of conductive polymers, non-conductive polymers, semi-conductive polymers, metals, metal alloys, dielectrics, carbon, graphites, oxides, aluminum, aluminum oxide, zinc oxide, aluminum copper, aluminum doped zinc oxide, gallium doped zinc oxide, paint, and highly-oriented pyrolytic graphite. The substrate may be selected from one of a flexible substrate and an inflexible substrate. A plasma from the number of nozzles in the plasma deposition unit may be directed through the number of meshes in the mesh system in which the number of meshes may be located between the plasma deposition unit and the substrate in which a mesh may be comprised of the number of materials and the plasma may cause a portion of the number of materials from the mesh to be deposited onto the substrate. The substrate may be moved relative to the plasma while the number of materials is deposited onto the substrate.

The features, functions, and advantages may be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof will best be understood by reference to the following detailed description of an advantageous embodiment of the present disclosure when read in conjunction with the accompanying drawings, wherein:

DETAILED DESCRIPTION

The different advantageous embodiments recognize and take into account one or more considerations. For example, the advantageous embodiments recognize and take into account that currently available plasma deposition systems may not provide as much control in depositing materials onto a substrate as desired.

For example, the different advantageous embodiments recognize and take into account that in some cases, a gradient may be desired with respect to the concentration of a material being deposited onto a substrate. For example, it may be desirable to deposit zinc oxide on one portion of the substrate, zinc oxide plus aluminum at about five percent in another portion of the substrate, and zinc oxide plus aluminum at about 10 percent in yet another portion of the substrate.

The different advantageous embodiments recognize and take into account that this type of control may not be currently present for atmospheric plasma deposition units. Further, the different advantageous embodiments recognize and take into account that currently used plasma and vapor deposition systems may not allow for depositing different types of materials on different portions of the substrate.

Thus, the advantageous embodiments provide a method and apparatus for depositing material onto a substrate. In one advantageous embodiment, an apparatus may comprise a plasma deposition unit, a movement system, and a mesh system. The atmospheric plasma deposition unit may be configured to generate a plasma. The movement system may be configured to move the substrate under the atmospheric plasma deposition unit. The mesh system may be located between the plasma deposition unit and the substrate. The mesh may comprise a number of materials for deposition onto the substrate. Plasma passing through the mesh may cause a portion of the number of materials from the mesh to be desorbed, activated, and/or deposited onto the surface of the substrate. Plasma desorption and further molecular activation or ionization may refer to the interaction of plasma species, such as ions or neutral atoms, with a solid or liquid target surface. The collision of plasma species with the target material may physically or chemically desorb sub-atomic, atomic, or molecular structures from the target material. In parallel and/or series, activation may refer to the sub-atomic, atomic, or molecular change of the target material as a result of the collision with plasma species. In plasma treatment, these collisions may be used to activate the surface in order to improve adhesion properties of the surface. In plasma desorption, these collisions may be used to free sub-atomic, atomic, and/or molecular species from the target and turn these species into free species in the gas phase. Subsequently, these species may be deposited through physical or chemical adsorption onto a surface forming a film.

Figure 1:
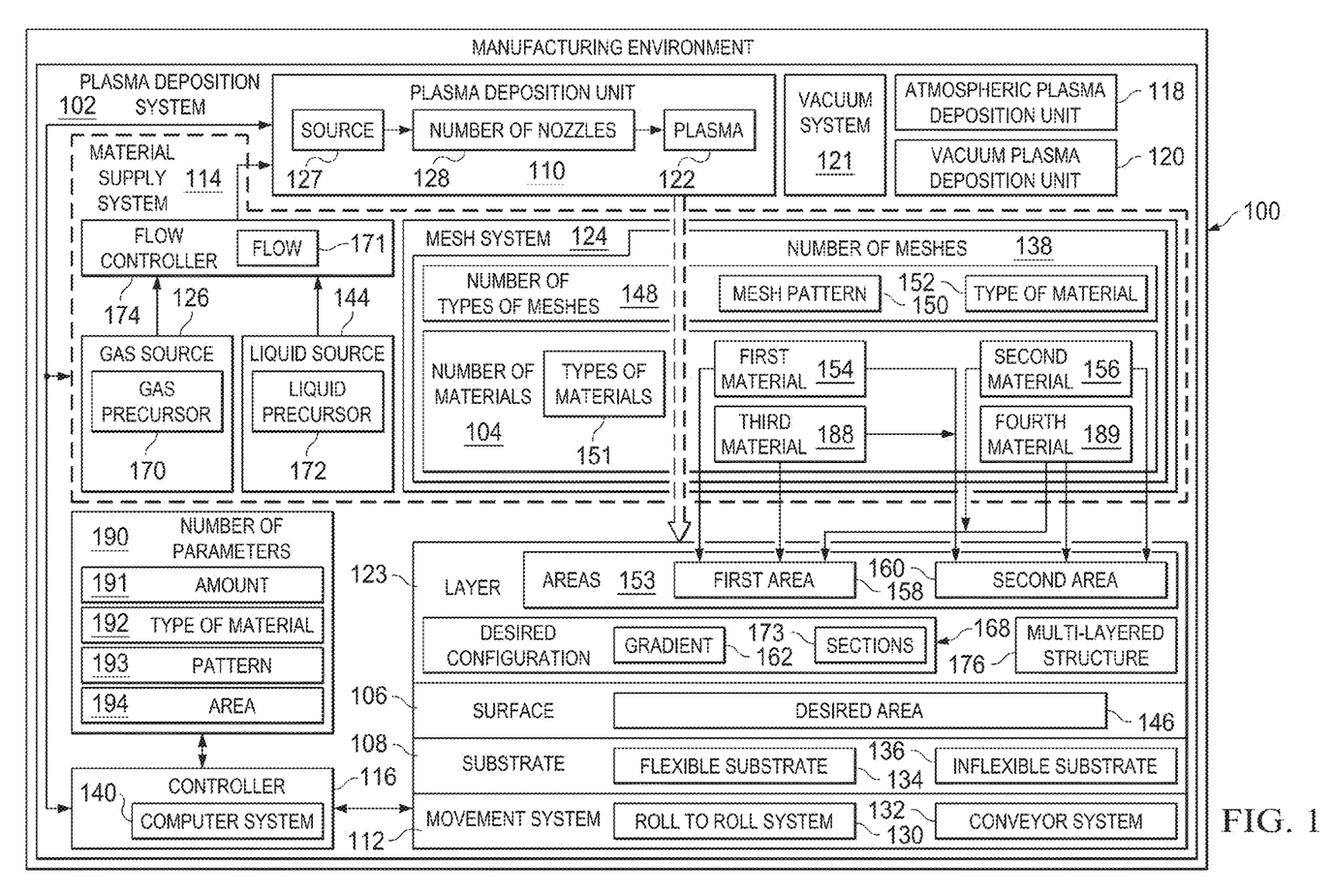
FIG. 1 is an illustration of a manufacturing environment in accordance with an advantageous embodiment.

With reference now to the figures and, in particular, with reference now to FIG. 1, an illustration of a manufacturing environment is depicted in accordance with an advantageous embodiment. In this illustrative example, manufacturing environment 100 may comprise plasma deposition system 102. Plasma deposition system 102 may be configured to deposit number of materials 104 onto surface 106 of substrate 108.

Number of materials 104 may be selected from at least one of, for example, without limitation, conductive polymers, non-conductive polymers, semi-conductive polymers, metals, metal alloys, dielectrics, carbon, graphites, oxides, aluminum, aluminum oxide, zinc oxide, aluminum copper, aluminum doped zinc oxide, gallium doped zinc oxide, paint, highly-oriented pyrolytic graphite, and other suitable materials. Of course, other materials may be used in addition to or in place of the ones described herein.

As used herein, the phrase "at least one of", when used with a list of items, means different combinations of one or more of the listed items may be used and only one of each item in the list may be needed. For example, "at least one of item A, item B, and item C" may include, for example, without limitation, item A, or item A and item B. This example also may include item A, item B, and item C, or item B and item C. Also, as used herein with reference to items, a "number of items" is one or more items. For example, "number of materials 104" is one or more materials.

In these illustrative examples, plasma deposition system 102 may comprise plasma deposition unit 110, movement system 112, material supply system 114, and controller 116.

Plasma deposition unit 110 may generate plasma 122. Plasma deposition unit 110 may be selected from one of atmospheric plasma deposition unit 118 and vacuum plasma deposition unit 120. When plasma deposition unit 110 is vacuum deposition unit 120, vacuum system 121 also may be present.

Movement system 112 may be configured to move substrate 108 relative to plasma deposition unit 110. Material supply system 114 may be configured to supply number of materials 104 for deposition onto surface 106 of substrate 108. Controller 116 may be configured to control the operation of other components in plasma deposition system 102 in depositing number of materials 104 onto surface 106 of substrate 108 to form layer 123. For example, controller 116 may be configured to control the deposition of layer 123 of number of materials 104 onto substrate 108.

For example, controller 116 may be configured to control number of parameters 190 for depositing number of materials 104 onto substrate 108. Number of parameters 190 may comprise at least one of amount 191 of number of materials 104, type of material 192 for number of materials 104, pattern 193 of number of materials 104, and area 194 in which number of materials 104 may be deposited onto surface 106 of substrate 108. Of course, controller 116 may be configured to control any other suitable parameters in depositing number of materials 104 onto surface 106 of substrate 108.

In these illustrative examples, controller 116 may comprise hardware and also may include software. Controller 116 may be implemented using computer system 140. Computer system 140 may be one or more computers. If computer system 140 is comprised of more than one computer, those computers may be in communication with each other.

In these illustrative examples, material supply system 114 may be configured to supply number of materials 104. Material supply system 114 may comprise at least one of mesh system 124, gas source 126, liquid source 144, and other suitable sources of number of materials 104.

As depicted, mesh system 124, gas source 126, and liquid source 144 may each be a different type of material in number of materials 104. Further, mesh system 124 may be comprised of multiple materials in number of materials 104. Number of materials 104 may form mesh system 124 or may coat structures in mesh system 124.

Gas source 126, liquid source 144, or both may use precursors in the form of a liquid or gas in combination with mesh system 124. In other words, gas source 126 may have gas precursor 170, and liquid source 144 may have liquid precursor 172. The flow of these materials may be controlled to deposit doped materials with variable or non-variable chemical composition. With mesh system 124, number of meshes 138 may be replaced when number of materials 104 erode from use of number of meshes 138. This replacement of number of meshes 138 may occur in between uses of plasma deposition unit 110 to deposit number of materials 104 onto surface 106 of substrate 108. Some or all of number of meshes 138 may be replaced depending on which of number meshes have depleted number of materials 104.

Flow 171 of gas precursor 170 and/or liquid precursor 172 from gas source 126 and/or liquid source 144 may be controlled by flow controller 174. Flow controller 174 may be any device and/or system that is configured to control a pressure, flow rate, and other parameters with respect to the movement of gas precursor 170 and/or liquid precursor 172 into plasma 122.

For example, gas precursor 170 and/or liquid precursor 172 may be delivered by flow controller 174 at flow rates and/or pressures selected to obtain a desired final composition of layer 123.

Gas precursor 170 and/or liquid precursor 172 also may be used to form multi-layered structure 176 of a number of materials that are formed with gas precursor 170, liquid precursor 172, and number of materials 104 in mesh system 124, or some combination thereof. In one illustrative example, gas precursor 170 and/or liquid precursor 172 may be used to form adhesive films to enhance film performance. Number of materials 104 in mesh system 124 may be used to form transparent conductive layers. Then, liquid precursor 172 may be used to form the erosion and abrasion resistant layers on top as a protection barrier for multi-layered structure 176.

Plasma deposition unit 110 may have source 127 and number of nozzles 128. Source 127 may be any device configured to generate plasma 122. For example, source 127 may be implemented with any currently used plasma generation device. Plasma generation devices that may be used in source 127 include, for example, without limitation, glow discharge, capacitively coupled plasma, inductively coupled plasma, wave heated plasma, arc discharge, corona discharge, and capacitive discharge systems.

Number of nozzles 128 may direct plasma 122 from source 127 toward substrate 108. When number of materials 104 is present in plasma 122, number of materials 104 may be deposited onto substrate 108.

In these illustrative examples, movement system 112 may move substrate 108 relative to number of nozzles 128 in plasma deposition unit 110 while plasma 122 is generated. The movement of substrate 108 relative to number of nozzles 128 may result in number of materials 104 being deposited in desired area 146 on surface 106 of substrate 108. In these illustrative examples, substrate 108 may move past number of nozzles 128.

In these illustrative examples, movement system 112 may take a number of different forms. For example, movement system 112 may be comprised of at least one of roll to roll system 130, conveyor system 132, and other suitable movement systems configured to move substrate 108. When movement system 112 takes the form of roll to roll system 130, substrate 108 may be flexible substrate 134. Flexible substrate 134 may be, for example, without limitation, polyimide, transparent polyester, polyether ether ketone, polyethylene terephthalate, and other suitable substrates.

When conveyor system 132 is used to implement movement system 112, substrate 108 may take the form of inflexible substrate 136, such as a semiconductor wafer, an aircraft part, or an automobile part.

Mesh system 124 may be located between plasma deposition unit 110 and substrate 108. As a result, plasma 122 may pass through mesh system 124. Plasma 122 may pass through mesh system 124 in a manner such that a portion of number of materials 104 from mesh system 124 is carried in plasma 122 for deposition onto surface 106 of substrate 108.

As depicted, mesh system 124 may comprise number of meshes 138. Each mesh in number of meshes 138 may be located between a nozzle in number of nozzles 128 and substrate 108. In other illustrative examples, number of meshes 138 may be a single mesh located between number of nozzles 128 and substrate 108.

Number of meshes 138 may be comprised of number of types of meshes 148. As a result, one mesh in number of meshes 138 may be a different type of mesh as compared to another mesh in number of meshes 138. In these illustrative examples, when different types of material are present in number of meshes 138, different materials in number of materials 104 may be deposited onto different parts of substrate 108.

Mesh pattern 150 and type of material 152 may be selected for each type of mesh in number of types of meshes 148. Mesh pattern 150 and type of material 152 may be the same or different for each type of mesh in number of types of meshes 148 in number of meshes 138, depending on the particular implementation. Mesh pattern 150 may be, for example, without limitation, a zigzag pattern, a rectangular pattern, a circular pattern, a fractal pattern, or some other suitable configuration.

In these illustrative examples, number of meshes 138 may be selected to provide desired configuration 168 for number of materials 104 when number of materials 104 is deposited onto substrate 108. The selection of materials for number of materials 104 may be any material of interest that is to be deposited onto substrate 108. In particular, desired configuration 168 may be, for example, without limitation, at least one of gradient 162 in which an amount of a material in number of materials 104 deposited varies, sections 173, and other suitable configurations.

For example, number of materials 104 in mesh system 124 may comprise a plurality of types of materials 151 in which a portion of each type of material may be deposited onto a number of areas in a plurality of areas 153 on surface 106 of substrate 108. In other words, a material in number of materials 104 may be a type of material for number of materials 104.

For example, first material 154 and second material 156 may be different types of materials in a plurality of types of materials 151. As a result, a portion of first material 154 in mesh system 124 may be deposited onto surface 106 of substrate 108, while a portion of second material 156 may also be deposited onto a different portion of surface 106 of substrate 108. In particular, the portion of first material 154 may be deposited onto first area 158 on surface 106 of substrate 108. The portion of second material 156 may be deposited onto second area 160 of surface 106 of substrate 108.

In some illustrative examples, first area 158 and second area 160 may overlap. In this manner, mesh system 124 may be used with plasma deposition unit 110 to create gradient 162 in depositing number of materials 104 onto surface 106 to form layer 123 of number of materials 104. With this implementation, different meshes in number of meshes 138 may have different concentrations of number of materials 104.

Another example of desired configuration 168 may include depositing multiple materials onto two or more areas. For example, a portion of first material 154 and a portion of second material 156 may be deposited onto second area 160. Alternatively, at least one of first material 154, second material 156, third material 188, and fourth material 189 may be deposited onto first area 158. A different combination of at least one of first material 154, second material 156, third material 188, and fourth material 189 may be deposited onto second area 160. Of course, any number and/or combination of materials may be deposited in any number and/or combination of areas depending on the particular implementation.

Thus, with plasma deposition system 102, greater control in depositing materials onto a substrate may be performed. In particular, with plasma deposition system 102, more than one material may be deposited onto substrate 108 in number of materials 104. As a result, plasma deposition system 102 may provide greater control in depositing more than one material onto substrate 108.

With an advantageous embodiment, substrate 108 may be processed to form different types of items. For example, substrate 108 may be processed to form an organic light-emitting diode display, an integrated circuit, a processor, a display device, a sensor, a solar cell, an aircraft window or windshield, an automobile window or windshield, a medical device, a biomedical implant, an engineered tissue, and/or other suitable items. Further, mesh system 124 may be used with plasma deposition unit 110 in either a form of atmospheric plasma deposition unit 118 or vacuum plasma deposition unit 120.

The illustration of manufacturing environment 100 in FIG. 1 is not meant to imply physical or architectural limitations to the manner in which an advantageous embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an advantageous embodiment.

For example, additional plasma deposition systems may be present in addition to plasma deposition system 102. Further, other processing equipment also may be present in manufacturing environment 100. As another example, rather than forming layer 123 by itself, number of materials 104 may be deposited as a multi-layered stack of materials. Further, a mesh in number of meshes 138 may be comprised of more than one type of material.

In still another illustrative example, controller 116 may take the form of circuits that control the operation of plasma deposition unit 110. For example, controller 116 may be implemented using an application-specific integrated circuit (ASIC).

Figure 2:
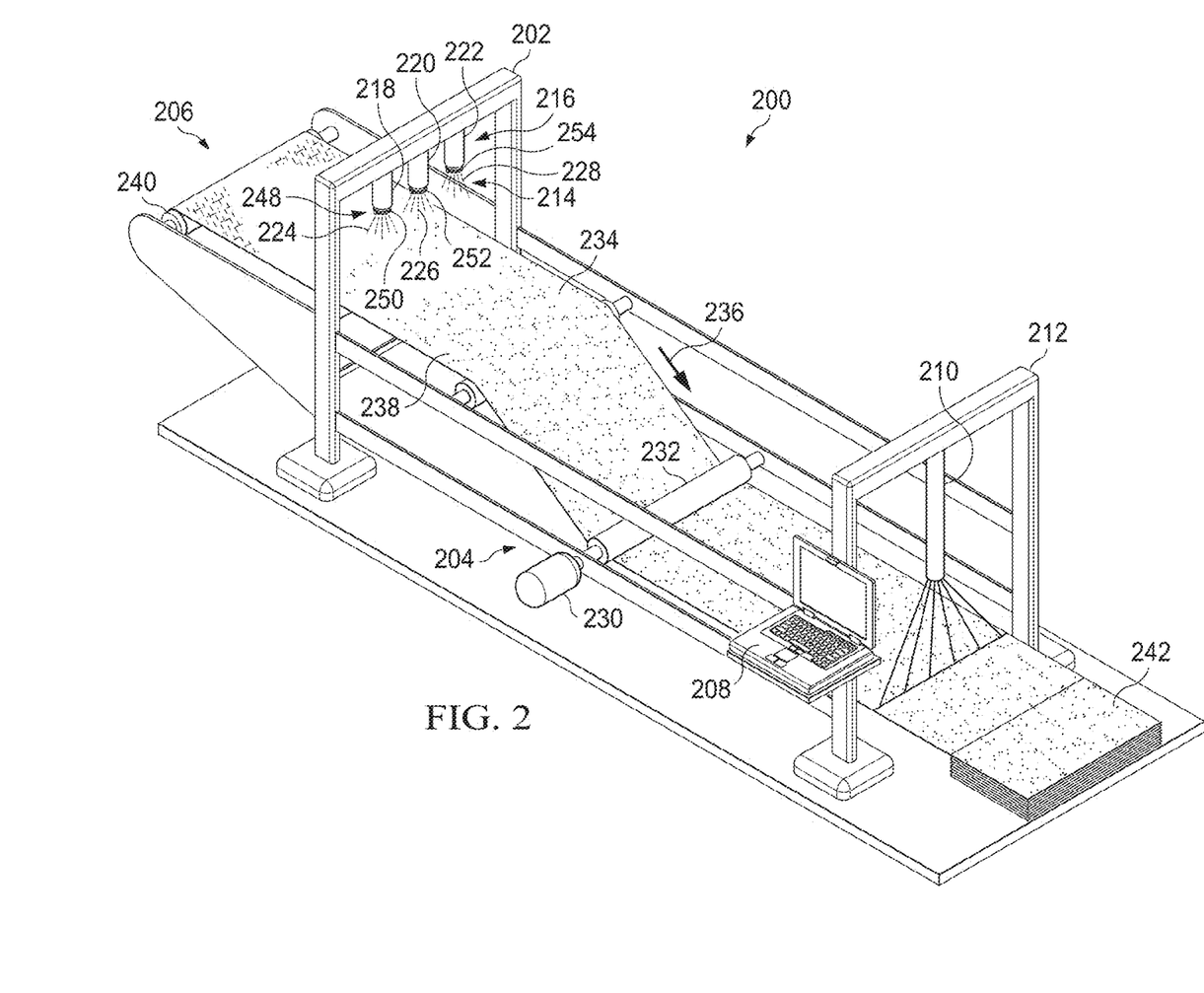
FIG. 2 is an illustration of a plasma deposition system in accordance with an advantageous embodiment.

Turning next to FIG. 2, an illustration of a plasma deposition system is depicted in accordance with an advantageous embodiment. Plasma deposition system 200 is an example of a physical implementation for plasma deposition system 102 in FIG. 1.

As depicted, plasma deposition system 200 comprises plasma deposition unit 202, movement system 204, material supply system 206, controller 208, laser cutter 210, and frame 212. In these illustrative examples, plasma deposition unit 202, movement system 204, material supply system 206, controller 208, and laser cutter 210 may be associated with frame 212.

When one component is "associated" with another component, the association is a physical association in these depicted examples. For example, a first component, plasma deposition unit 202, may be considered to be associated with a second component, frame 212, by being secured to the second component, bonded to the second component, mounted to the second component, welded to the second component, fastened to the second component, and/or connected to the second component in some other suitable manner. The first component also may be connected to the second component using a third component. The first component may also be considered to be associated with the second component by being formed as part of and/or an extension of the second component.

Plasma deposition unit 202 may be configured to generate plasma 214. In this illustrative example, plasma 214 may flow from number of nozzles 216 in plasma deposition unit 202. As illustrated, number of nozzles 216 may comprise nozzle 218, nozzle 220, and nozzle 222. Plasma 214 may flow from nozzle 218, nozzle 220, and nozzle 222 as plasma flow 224, plasma flow 226, and plasma flow 228, respectively.

In this illustrative example, movement system 204 may comprise motor 230 and roller 232. Motor 230 may rotate roller 232 such that substrate 234 moves in the direction of arrow 236. In this illustrative example, substrate 234 may take the form of flexible substrate 238. In these illustrative examples, number of meshes 248 in material supply system 206 may be associated with number of nozzles 216. As depicted, mesh 250, mesh 252, and mesh 254 in number of meshes 248 may be associated with nozzle 218, nozzle 220, and nozzle 222, respectively. As a result, plasma 214 in plasma flow 224, plasma flow 226, and plasma flow 228 may flow through mesh 250, mesh 252, and mesh 254, respectively. Flexible substrate 238 may be stored on roller 240 on movement system 204.

As depicted, substrate 234 may move in the direction of arrow 236 past number of nozzles 216 in plasma deposition unit 202. Substrate 234 may move in the direction of arrow 236, while plasma deposition unit 202 may be fixed.

As substrate 234 moves in the direction of arrow 236, laser cutter 210 may cut substrate 234 into units 242. Units 242 may take various forms. For example, without limitation, a unit in units 242 may be a display, a solar cell unit, an integrated circuit system, or some other suitable type of unit.

Figure 3:
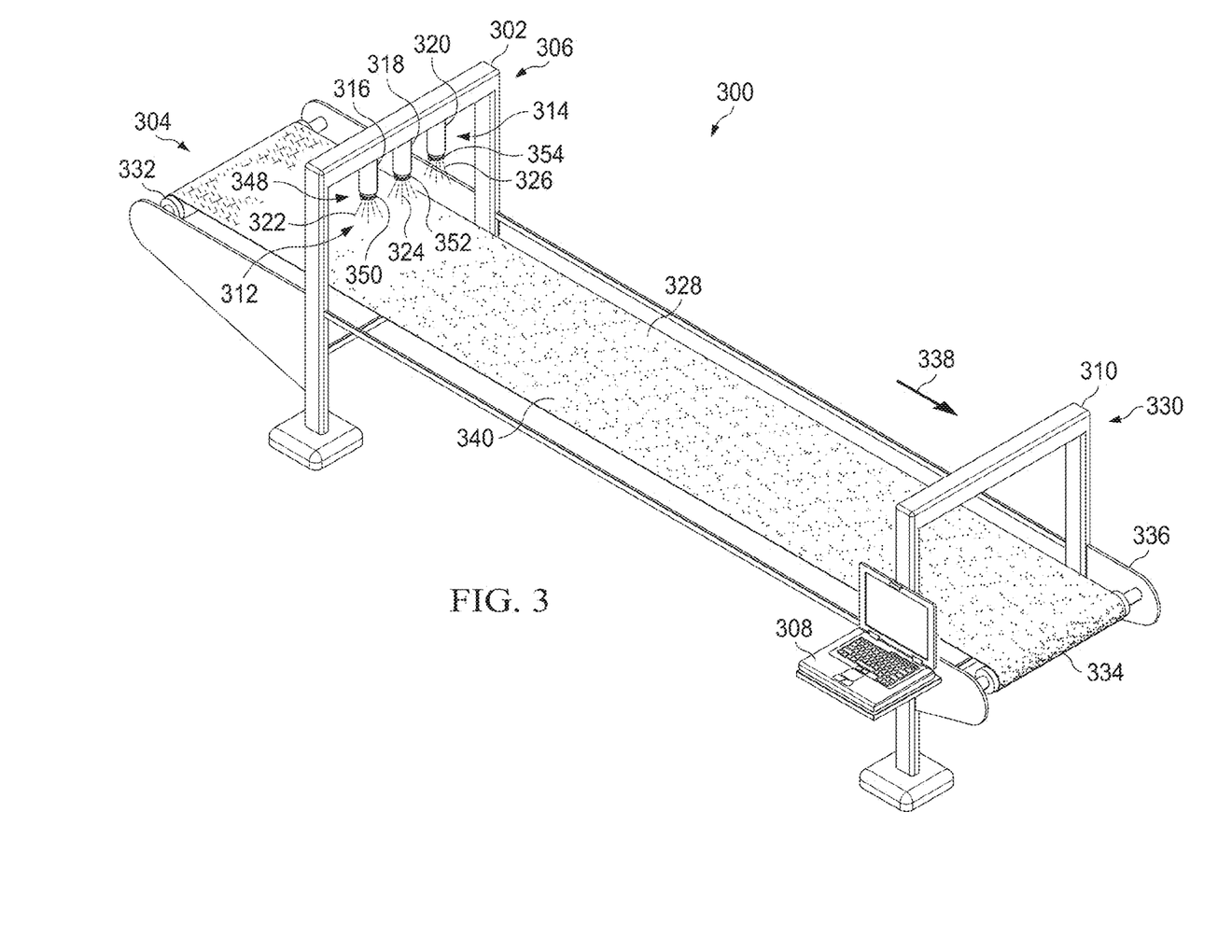
FIG. 3 is an illustration of a plasma deposition system in accordance with an advantageous embodiment.

Turning next to FIG. 3, an illustration of a plasma deposition system is depicted in accordance with an advantageous embodiment. Plasma deposition system 300 is another example of an implementation for plasma deposition system 102 in FIG. 1.

In this example, plasma deposition system 300 may comprise plasma deposition unit 302, movement system 304, material supply system 306, controller 308, and frame 310. Plasma deposition unit 302, movement system 304, material supply system 306, and controller 308 may be associated with frame 310.

As illustrated, plasma deposition unit 302 may generate plasma 312. Plasma 312 may be generated by number of nozzles 314 in plasma deposition unit 302. In this illustrative example, plasma flow 322, plasma flow 324, and plasma flow 326 may form plasma 312. In these illustrative examples, plasma 312 may flow through nozzle 316, nozzle 318, and nozzle 320 in the form of plasma flow 322, plasma flow 324, and plasma flow 326, respectively.

As depicted, number of meshes 348 in material supply system 306 may be associated with number of nozzles 314. Each mesh in number of meshes 348 may be associated with a nozzle in number of nozzles 314. In other words, each nozzle in number of nozzles 314 may have a different mesh from number of meshes 348. For example, without limitation, mesh 350, mesh 352, and mesh 354 in number of meshes 348 may be associated with nozzle 316, nozzle 318, and nozzle 320, respectively.

As a result, plasma 312 in plasma flow 322, plasma flow 324, and plasma flow 326 may flow through mesh 350, mesh 352, and mesh 354, respectively.

Substrate 328 may be moved by movement system 304, which may take the form of roll to roll system 330 in this illustrative example. Movement system 304 may comprise roller 332, roller 334, and motor 336. Motor 336 may be configured to rotate roller 334 such that substrate 328 moves in the direction of arrow 338. In this illustrative example, substrate 328 may be flexible substrate 340 in which flexible substrate 340 may originate from roller 332 and may be received at roller 334.

Figures 4, 4A:
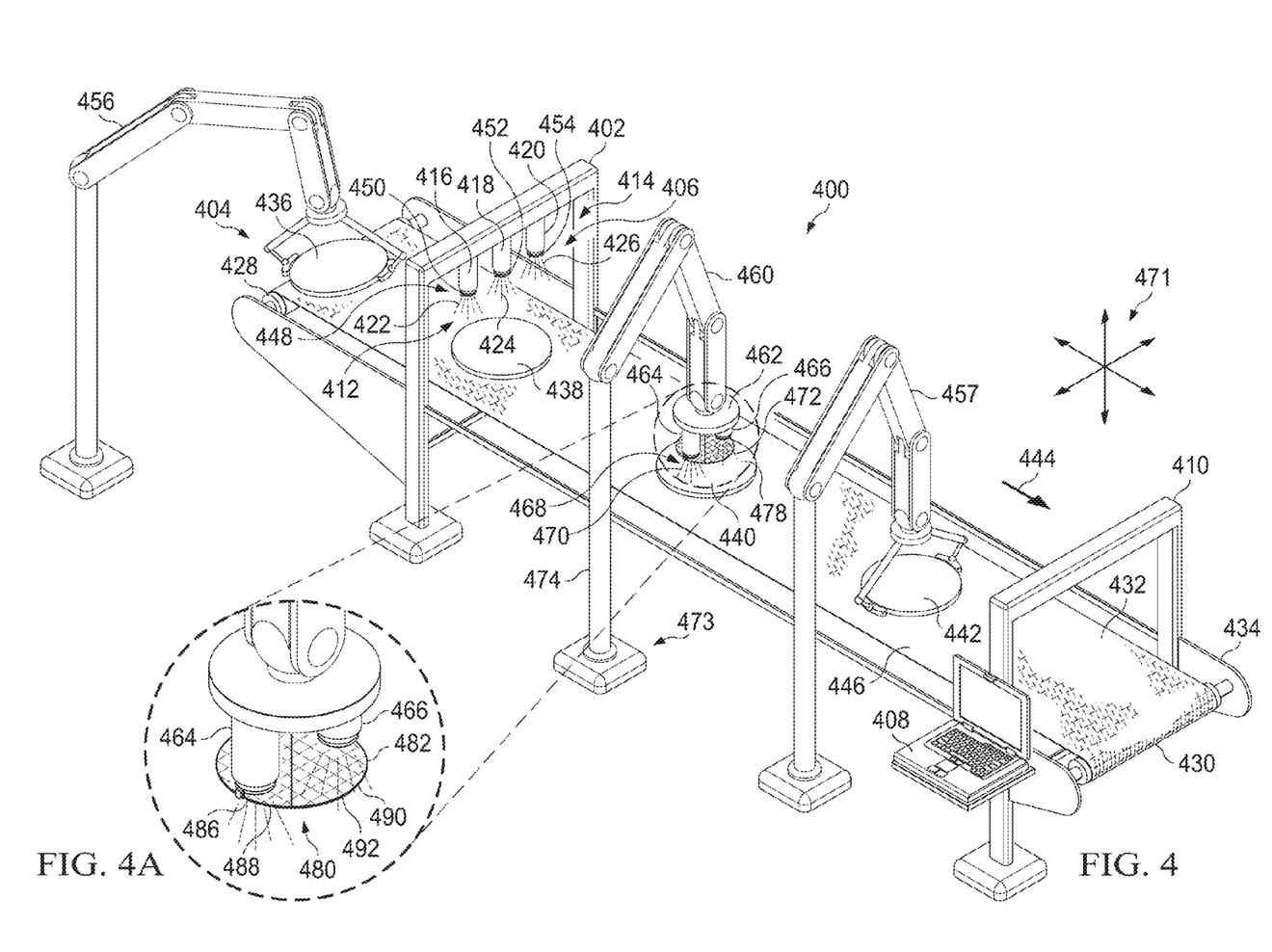
FIG. 4 is another illustration of a plasma deposition system in accordance with an advantageous embodiment.
FIG. 4A is an enlarged illustration of nozzles on a plasma deposition unit of the plasma deposition system of FIG. 4 in accordance with an advantageous embodiment.

Turning next to FIG. 4, another illustration of a plasma deposition system is depicted in accordance with an advantageous embodiment. In this illustrative example, plasma deposition system 400 may be an example of another implementation for plasma deposition system 102 in FIG. 1.

As illustrated, plasma deposition system 400 may comprise plasma deposition unit 402, movement system 404, material supply system 406, controller 408, and frame 410. Plasma deposition unit 402, movement system 404, material supply system 406, and controller 408 may be associated with frame 410.

Plasma deposition unit 402 may be configured to generate plasma 412. Plasma 412 may be generated by number of nozzles 414. In particular, number of nozzles 414 may comprise nozzle 416, nozzle 418, and nozzle 420. Nozzle 416 may generate plasma flow 422, nozzle 418 may generate plasma flow 424, and nozzle 420 may generate plasma flow 426.

As depicted, number of meshes 448 in material supply system 406 may be associated with number of nozzles 414. As depicted, mesh 450, mesh 452, and mesh 454 in number of meshes 448 may be associated with nozzle 416, nozzle 418, and nozzle 420, respectively. As a result, plasma 412 in plasma flow 422, plasma flow 424, and plasma flow 426 may flow through mesh 450, mesh 452, and mesh 454, respectively.

In this illustrative example, movement system 404 may comprise roller 428, roller 430, belt 432, and motor 434. Belt 432 may move in response to motor 434 turning roller 430. Movement of belt 432 may cause substrates 436, 438, 440, and 442 to move in the direction of arrow 444 when these substrates are located on surface 446 of belt 432. In this depicted example, robotic arm 456 and robotic arm 457 may move substrates on and off of belt 432 along surface 446 of belt 432 during processing. Robotic arm 456 may place substrate 436 on surface 446 of belt 432. In this manner, a number of materials (not shown) in plasma 412 may be deposited onto substrate 436. After processing, robotic arm 457 may remove a substrate, such as substrate 442, from surface 446 of belt 432 for other processing. In some illustrative examples, robotic arm 456 and robotic arm 457 may be considered part of movement system 404 rather than separate components.

Additionally, plasma deposition system 400 also may include plasma deposition unit 460. Plasma deposition unit 460 may have number of nozzles 462. In particular, plasma deposition unit 460 may have nozzle 464 and nozzle 466 in these depicted examples.

As another illustrative example, number of meshes 480 in material supply system 406 may be a single mesh. Different materials may be present in different areas with respect to locations for number of nozzles 462. In this illustrative example, number of meshes 480 may take the form of mesh 482. Mesh 482 may be associated with both nozzle 464 and nozzle 466. As depicted, mesh 482 may have material 486 in section 488 of mesh 482. Material 490 may be present in section 492 of mesh 482. Section 488 may be positioned relative to nozzle 464 and section 492 may be positioned relative to nozzle 466.

This configuration is in contrast to using a single mesh for each nozzle. Of course, in some illustrative examples, mesh 482 may have only material 486. Further, the concentration of material 486 may be different in section 488 and in section 492.

In yet another illustrative example, both material 486 and material 490 may be present in section 488. With this configuration, plasma 468 may flow as plasma flow 470 from nozzle 464 through section 488 of mesh 482. Plasma 468 in plasma flow 470 may carry material 486, material 490, and/or any other material in section 492 of mesh 482 for deposition onto substrate 440.

If both material 486 and material 490 may be present in section 492, plasma 468 may flow as plasma flow 472 through section 492 of mesh 482, and plasma 468 in plasma flow 472 may carry material 486, material 490, and/or any other material in section 492 of mesh 482 for deposition onto substrate 440.

In this illustrative example, plasma deposition unit 460 may be movable with respect to substrates, such as substrate 440. In this illustrative example, plasma deposition unit 460 may be movable along number of different axes 471.

In these illustrative examples, positioning system 473 may be configured to move plasma deposition unit 460. Positioning system 473 may be robotic arm 474 in this illustrative example. Of course, any positioning system may be used that provides a desired movement for plasma deposition unit 460.

With the ability for plasma deposition unit 460 to move about a number of axes, plasma deposition unit 460 may be positioned to provide desired deposition of materials. This type of movement may be useful when substrate 440 is non-planar. Plasma deposition unit 460 may follow contour 478 on substrate 440.

Figure 5:
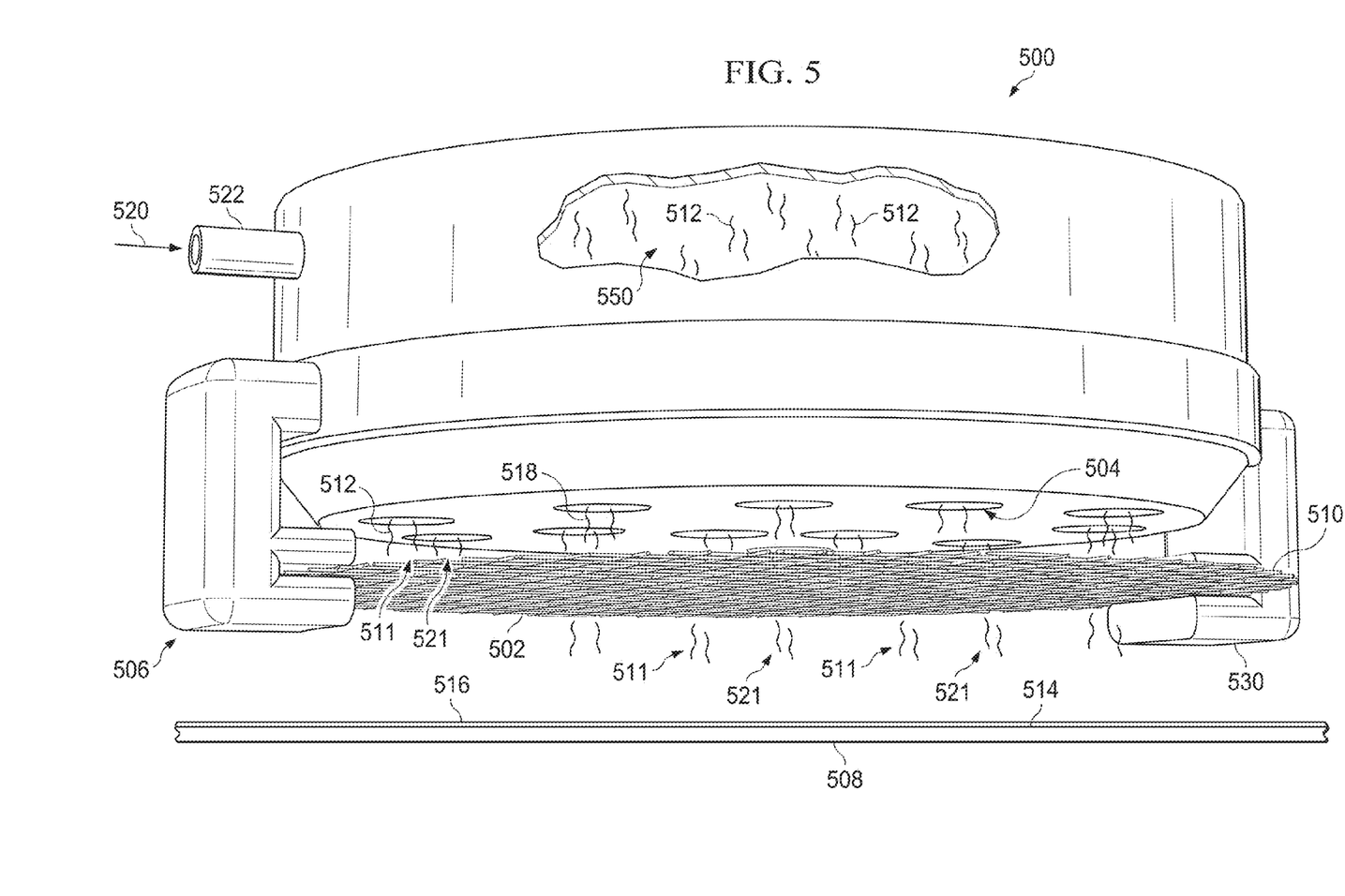
FIG. 5 is an illustration of a nozzle with a mesh in accordance with an advantageous embodiment.

Turning next to FIG. 5, an illustration of a nozzle with a mesh is depicted in accordance with an advantageous embodiment. In this illustrative example, nozzle 500 may be an example of an implementation for a nozzle within number of nozzles 128 in FIG. 1. Mesh 502 may be an example of an implementation for a mesh within number of meshes 138 for material supply system 114 in FIG. 1.

In this illustrative example, mesh 502 may be positioned relative to openings 504 in nozzle 500 by bracket system 506. In this manner, mesh 502 may be positioned between nozzle 500 and substrate 508.

As depicted, mesh 502 may be comprised of material 510. As a result, when plasma 512 flows from nozzle 500 through mesh 502, portion 511 of material 510 may be carried in plasma 512. Portion 511 of material 510 carried in plasma 512 may be deposited onto surface 514 of substrate 508. In this manner, layer 516 of material 510 may be formed on surface 514 of substrate 508.

In these illustrative examples, portion 511 of material 510 may be atoms from material 510 carried in plasma 512. Plasma 512 may be plasma flow 518.

In addition to material 510 from mesh 502, material 520 may be introduced through inlet 522 and introduced into plasma 512 in interior 550 of nozzle 500 as plasma 512 flows towards openings 504 in the partially exposed view of nozzle 500. As a result, portion 521 of material 520 may be carried in plasma 512.

In this manner, both material 510 and material 520 may be present in portion 511 of material 510 and in portion 521 of material 520, respectively, carried in plasma 512, depending on the particular implementation. In this illustrative example, material 520 may take the form of a liquid, gas, or some other suitable fluid. In still other illustrative examples, material 520 may take the form of a solid, such as a powder.

As depicted, mesh 502 may comprise structure 530 with material 510 on structure 530. Material 510 may be deposited, coated, or otherwise associated with structure 530. Structure 530 may be comprised of any material configured to be associated with material 510. For example, without limitation, structure 530 may be comprised of steel, titanium, aluminum, and/or any other suitable material. In some illustrative examples, structure 530 may be comprised of material 510.

In these illustrative examples, the use of mesh 502 may provide better control of the deposition of material 510 from mesh 502 than the deposition of material 520 as a gas, liquid, and/or other fluid. Further, the use of material 510 from mesh 502 may be more environmentally friendly as compared to using material 520 in the form of a powder.

Figure 6:
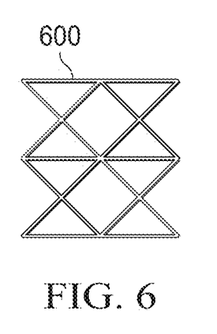
FIG. 6 is an illustration of a type of mesh in accordance with an advantageous embodiment.
Figure 7:
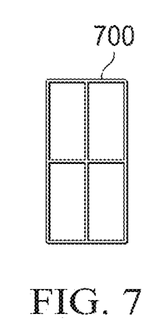
FIG. 7 is an illustration of a type of mesh in accordance with an advantageous embodiment.
Figure 8:
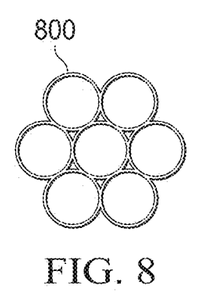
FIG. 8 is an illustration of a type of mesh in accordance with an advantageous embodiment.
Figure 9:
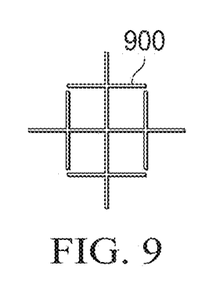
FIG. 9 is an illustration of a type of mesh in accordance with an advantageous embodiment.

Turning now to FIGS. 6-9, illustrations of different types of meshes are depicted in accordance with an advantageous embodiment. Turning first to FIG. 6, mesh 600 may have a zigzag pattern. Next, in FIG. 7, mesh 700 may have a rectangular pattern. In FIG. 8, mesh 800 may have a circular pattern. Next, in FIG. 9, mesh 900 may have a fractal pattern.

The illustrations of the different patterns of the different types of meshes are only provided for purposes of illustrating some examples of how a mesh may be implemented. Of course, other patterns or different types of meshes may be implemented based on the particular implementation.

The illustration of plasma deposition systems and components for the systems in FIGS. 2-9 may be combined with components in FIG. 1, used with components in FIG. 1, or a combination of the two. Additionally, some of the components in FIGS. 2-9 may be illustrative examples of how components shown in block form in FIG. 1 may be implemented as physical structures.

Figure 10:
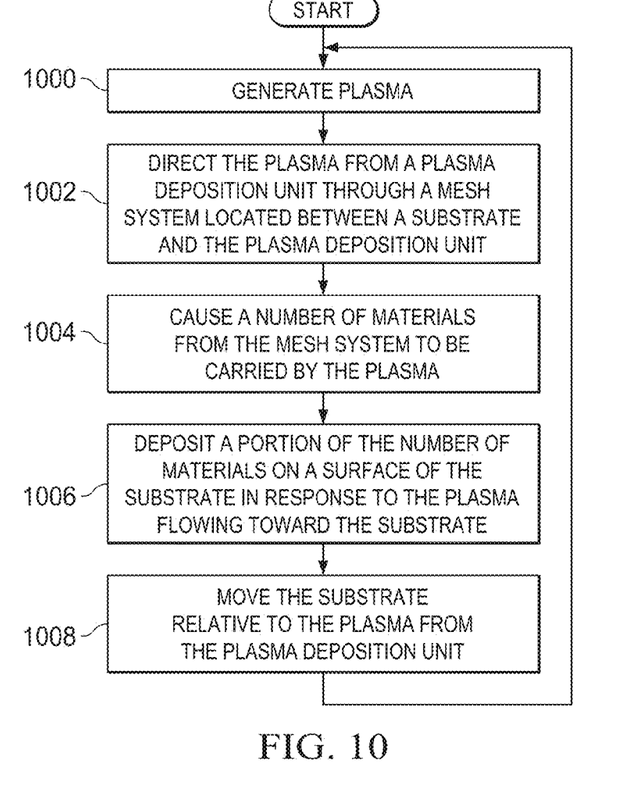
FIG. 10 is an illustration of a flowchart of a process for depositing a number of materials on a substrate in accordance with an advantageous embodiment.

Turning next to FIG. 10, an illustration of a flowchart of a process for depositing a number of materials on a substrate is depicted in accordance with an advantageous embodiment. The process illustrated in FIG. 10 may be implemented in manufacturing environment 100 in FIG. 1. In particular, the process may be implemented using plasma deposition system 102 in FIG. 1.

The process may begin by generating plasma 122 (operation 1000). The process may direct plasma 122 from plasma deposition unit 110 through mesh system 124 located between substrate 108 and plasma deposition unit 110 (operation 1002). The process may then cause number of materials 104 from mesh system 124 to be carried by plasma 122 (operation 1004). In this illustrative example, number of materials 104 may be from mesh 502 in FIG. 5.

Next, the process may deposit the portion of number of materials 104 on surface 106 of substrate 108 in response to plasma 122 flowing toward substrate 108 (operation 1006). The process may move substrate 108 relative to plasma 122 from plasma deposition unit 110 (operation 1008). The process may then return to operation 1000.

This process may be repeated any number of times until layer 123 of number of materials 104 has been deposited onto substrate 108.

Figure 11:
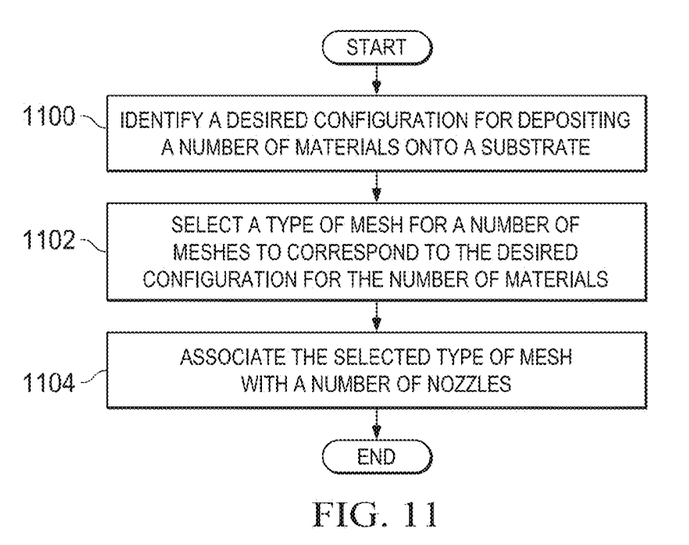
FIG. 11 is an illustration of a flowchart of a process for selecting meshes for a mesh system in accordance with an advantageous embodiment.

Turning next to FIG. 11, an illustration of a flowchart of a process for selecting meshes for a mesh system is depicted in accordance with an advantageous embodiment. The process illustrated in FIG. 11 may be implemented in manufacturing environment 100 in FIG. 1. In particular, this process may be used to select type of material 152 of number of types of meshes 148 in number of meshes 138 for use in mesh system 124 when depositing number of materials 104 onto substrate 108.

The process may begin by identifying desired configuration 168 for depositing number of materials 104 on substrate 108 (operation 1100). The process may select a type of mesh for number of meshes 138 to correspond to desired configuration 168 for number of materials 104 (operation 1102). Next, the selected type of mesh may be associated with number of nozzles 128 (operation 1104). The type of mesh may be at least one of type of material 152 and mesh pattern 150. The association of number of meshes 138 with number of nozzles 128 may occur such that the appropriate mesh is placed in front of a nozzle in the location desired for that material in number of materials 104 when deposited onto substrate 108. The process may terminate thereafter. In this manner, plasma deposition unit 110 may then deposit number of materials 104 with the desired configuration.

The flowcharts and block diagrams in the different depicted embodiments illustrate the architecture, functionality, and operation of some possible implementations of apparatus and methods in an advantageous embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an advantageous embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 12:
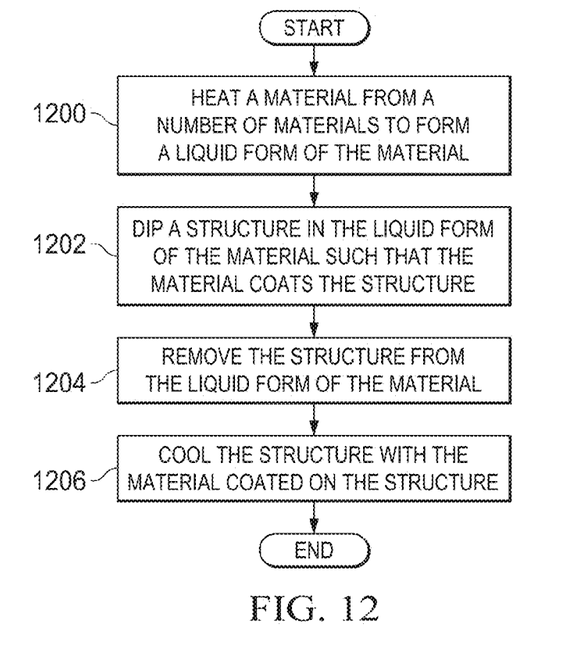
FIG. 12 is an illustration of a flowchart of a process for forming a mesh in accordance with an advantageous embodiment.

With reference now to FIG. 12, an illustration of a flowchart of a process for forming a mesh is depicted in accordance with an advantageous embodiment. In this illustrative example, number of meshes 138 may be manufactured for use in plasma deposition system 102 in FIG. 1.

The process may begin by heating material 510 from number of materials 104 to form a liquid form of material 510 (operation 1200). Next, the process may dip structure 530 in the liquid form of material 510 such that material 510 coats structure 530 (operation 1202). In these illustrative examples, structure 530 may be comprised of any material that may have a higher melting point than material 510 melted to coat structure 530.

Structure 530 may be removed from the liquid form of material 510 (operation 1204). Thereafter, structure 530 with material 510 coated on structure 530 may be cooled (operation 1206), with the process terminating thereafter.

Figure 13:
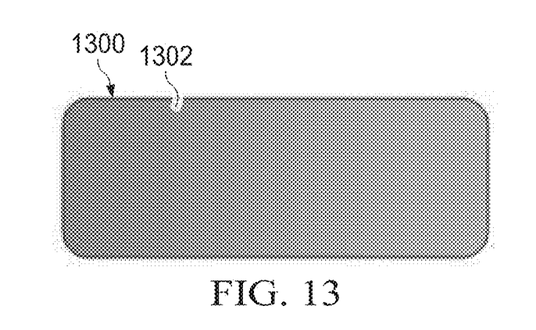
FIG. 13 is an illustration of a substrate with a gradient in accordance with an advantageous embodiment.

Turning next to FIG. 13, an illustration of a substrate with a gradient is depicted in accordance with an advantageous embodiment. In this illustrative example, substrate 1300 is shown from a top view. Substrate 1300 may be an example of an implementation for substrate 108 in FIG. 1. As depicted, material 1302 from mesh system 124 (not shown) may have been deposited onto substrate 1200 in the form of a gradient in which an amount of material 1302 varies. In other words, a variable concentration of a material may be deposited in material 1302 onto substrate 1300.

Figure 14:
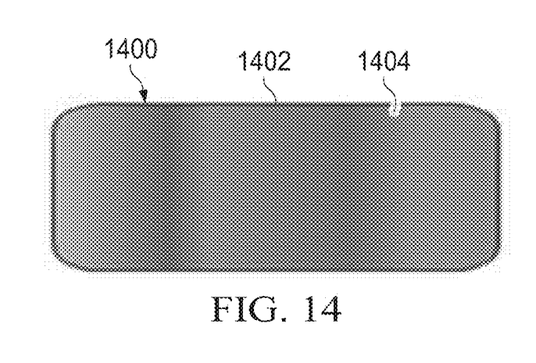
FIG. 14 is an illustration of a substrate with sections of materials in accordance with an advantageous embodiment.

Turning now to FIG. 14, an illustration of a substrate with sections of materials is depicted in accordance with an advantageous embodiment. In this illustrative example, substrate 1400 is also shown from a top view. Substrate 1400 may have sections 1402 of materials 1404 from mesh system 124 (not shown) deposited onto substrate 1400. Different types and/or amounts of materials may be present in different sections in sections 1402.

In this manner, increased control in the manner in which materials are deposited onto a substrate may occur using plasma deposition system 102 in FIG. 1. In particular, by selecting type of material 152 for number of meshes 138, plasma deposition system 102 may provide desired configuration 168 for number of materials 104 when deposited onto substrate 108 in FIG. 1.

Figure 15:
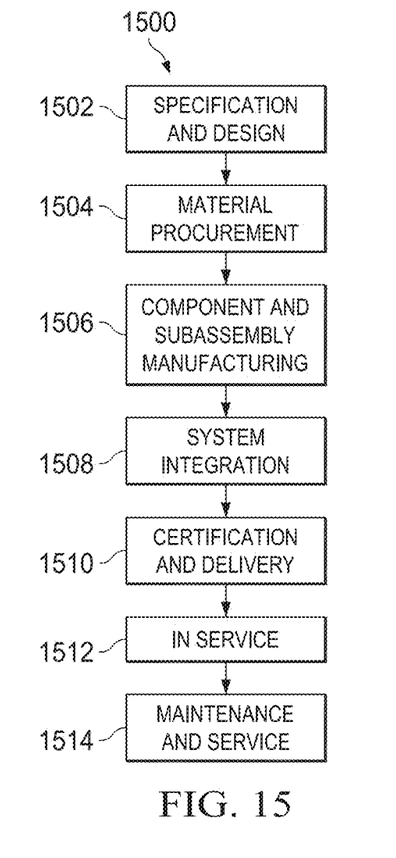
FIG. 15 is an illustration of an aircraft manufacturing and service method in accordance with an advantageous embodiment.
Figure 16:
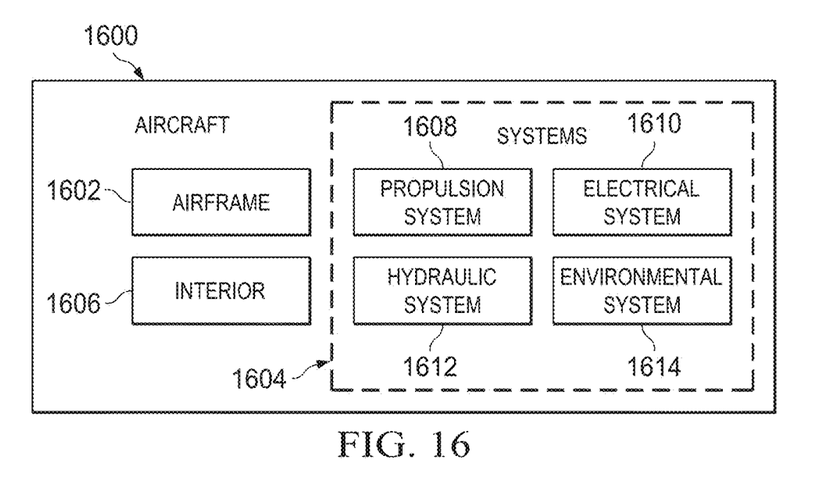
FIG. 16 is an illustration of an aircraft in which an advantageous embodiment may be implemented.

Advantageous embodiments of the present disclosure may be described in the context of aircraft manufacturing and service method 1500 as shown in FIG. 15 and aircraft 1600 as shown in FIG. 16. Turning first to FIG. 15, an illustration of an aircraft manufacturing and service method is depicted in accordance with an advantageous embodiment. During pre-production, aircraft manufacturing and service method 1500 may include specification and design 1502 of aircraft 1600 in FIG. 16 and material procurement 1504.

During production, component and subassembly manufacturing 1506 and system integration 1508 of aircraft 1600 in FIG. 16 may take place. Thereafter, aircraft 1600 may go through certification and delivery 1510 in order to be placed in service 1512. While in service 1512 by a customer, aircraft 1600 may be scheduled for routine maintenance and service 1514, which may include modification, reconfiguration, refurbishment, and other maintenance or service.

Each of the processes of aircraft manufacturing and service method 1500 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 16, an illustration of an aircraft is depicted in which an advantageous embodiment may be implemented. In this example, aircraft 1600 may be produced by aircraft manufacturing and service method 1500 in FIG. 15 and may include airframe 1602 with plurality of systems 1604 and interior 1606. Examples of systems 1604 may include one or more of propulsion system 1608, electrical system 1610, hydraulic system 1612, and environmental system 1614. Any number of other systems may be included. Plasma deposition using plasma deposition system 102 in FIG. 1 may be used to form devices and parts for any one of systems 1604, including one or more of propulsion system 1608, electrical system 1610, hydraulic system 1612, and environmental system 1614. These devices and parts may include integrated circuits, displays, and other devices that may be in systems 1604.

Although an aerospace example is shown, different advantageous embodiments may be applied to other industries. These other industries may include, for example, without limitation, the automotive industry, display industry, solar cell industry, semiconductor industry, biomedical device industry, biomedical implant industry, sensor industry, and other suitable industries.

Apparatuses and methods embodied herein may be employed during at least one of the stages of aircraft manufacturing and service method 1500 in FIG. 15. In one illustrative example, components or subassemblies produced in component and subassembly manufacturing 1506 in FIG. 15 may be fabricated or manufactured in a manner similar to components or subassemblies produced while aircraft 1600 is in service 1512 in FIG. 15. The components and subassemblies may be manufactured using an advantageous embodiment. In one example, at least one of electronic circuits, displays, and other devices may be manufactured using an advantageous embodiment. This manufacturing may occur during, for example, without limitation, component and subassembly manufacturing 1506 in which plasma deposition occurs using plasma deposition system 102 in FIG. 1.

As yet another example, one or more apparatus embodiments and/or method embodiments for plasma deposition using plasma deposition system 102 in FIG. 1 may be utilized during production stages, such as component and subassembly manufacturing 1506 and system integration 1508 in FIG. 15. One or more apparatus embodiments, method embodiments, or a combination thereof may be utilized during maintenance and service 1514 in FIG. 15. For example, at least one of electronic circuits, displays, and other devices may be manufactured using plasma deposition through plasma deposition system 102 during maintenance and service 1514. The use of a number of the different advantageous embodiments may substantially expedite the assembly of and/or reduce the cost of aircraft 1600.

With one or more advantageous embodiments, plasma desorption, plasma activation, and plasma deposition may be implemented by one simple device. The same plasma unit employed in this process may also be used for the activation or treatment of the surface prior, during, and after the film deposition. With an advantageous embodiment, gradients, sections of material, or both may be formed on substrates. Additionally, an advantageous embodiment may provide an ability to form multi-layered structures in a desired manner.

The description of the different advantageous embodiments has been presented for purposes of illustration and description and is not intended to be exhaustive or limited to the embodiments in the form disclosed. Many modifications and variations may be apparent to those of ordinary skill in the art. For example, plasma deposition system 102 may be used to apply paint to a substrate. For example, resin materials and polymers for paint may be used for materials on the meshes.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for depositing materials, the method comprising:
   directing a plasma from an atmospheric plasma deposition unit through a mesh system located between the atmospheric plasma deposition unit and a substrate, wherein a mesh of the mesh system is comprised of a number of materials and the plasma causes a portion of the number of materials to be desorbed from the mesh and to be deposited onto the substrate; and
   moving the substrate under the atmospheric plasma deposition unit relative to the plasma with a roll to roll movement system, while the number of materials is deposited onto the substrate.

2. The method of claim 1 further comprising:
   selecting a number of meshes for the mesh system based on a desired configuration for the number of materials to be deposited onto the substrate.

3. The method of claim 1, wherein the number of materials comprises a plurality of types of materials in which each plurality of the types of materials is configured to be deposited onto a number of areas in a plurality of the areas on the substrate.

4. The method of claim 1, wherein the atmospheric plasma deposition unit comprises a number of nozzles, the mesh system comprises a number of meshes, and the number of meshes is associated with the number of nozzles.

5. The method of claim 4, wherein the number of meshes is comprised of a number of types of meshes, wherein a type of mesh in the number of types of meshes is selected from at least one of a mesh pattern and a type of material.

6. The method of claim 1, wherein the number of materials is a first number of materials and further comprising:
   introducing a second number of materials into the plasma.

7. The method of claim 6, wherein the second number of materials is selected from at least one of a liquid, a gas, and a powder.

8. The method claim 1, wherein the number of materials is selected from at least one of conductive polymers, non-conductive polymers, semi-conductive polymers, metals, metal alloys, dielectrics, carbon, graphites, oxides, aluminum, aluminum oxide, zinc oxide, aluminum copper, aluminum doped zinc oxide, gallium doped zinc oxide, paint, and highly-oriented pyrolytic graphite.

9. The method of claim 1, wherein the substrate comprises a flexible substrate configured to be stored on a roller.

10. The method of claim 1, wherein the substrate comprises a semiconductor wafer.

11. A method for plasma deposition of materials on a substrate, the method comprising:
    selecting a number of meshes for a mesh system for a number of nozzles in an atmospheric plasma deposition unit based on a desired configuration for a number of materials to be deposited onto the substrate in which the number of materials is selected from at least one of conductive polymers, non-conductive polymers, semi-conductive polymers, metals, metal alloys, dielectrics, carbon, graphites, oxides, aluminum, aluminum oxide, zinc oxide, aluminum copper, aluminum doped zinc oxide, gallium doped zinc oxide, paint, and highly-oriented pyrolytic graphite; and in which the substrate is selected a flexible substrate;

directing a plasma from the number of nozzles in the atmospheric plasma deposition unit through the number of meshes in the mesh system in which the number of meshes is located between the atmospheric plasma deposition unit and the substrate in which a mesh is comprised of the number of materials and the plasma causes a portion of the number of materials from the mesh to be deposited onto the substrate; and moving the substrate relative to the plasma with a roll to roll movement system while the number of materials is deposited onto the substrate.

12. The method of claim 11, wherein the number of materials is a first number of materials and further comprising:

introducing a second number of materials into the plasma selected from at least one of a liquid, a gas, and a powder.

* * * * *